(12) United States Patent
Kawano

(10) Patent No.: US 7,230,324 B2
(45) Date of Patent: Jun. 12, 2007

(54) STROBE LIGHT CONTROL CIRCUIT AND IGBT DEVICE

(75) Inventor: Makoto Kawano, Fukuoka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/070,199

(22) Filed: Mar. 3, 2005

(65) Prior Publication Data

US 2005/0145880 A1    Jul. 7, 2005

Related U.S. Application Data

(63) Continuation of application No. 10/373,873, filed on Feb. 27, 2003, now Pat. No. 6,879,024.

(30) Foreign Application Priority Data

Sep. 12, 2002   (JP)   ............................. 2002/266666

(51) Int. Cl.
    *H01L 23/495*   (2006.01)
    *H01L 29/74*    (2006.01)
(52) U.S. Cl. ................... 257/676; 257/81; 257/82; 257/83; 257/107; 257/582; 257/586; 257/585; 257/666; 257/678
(58) Field of Classification Search ............... None
    See application file for complete search history.

(56) References Cited

U.S. PATENT DOCUMENTS 3,814,994 A    6/1974  Wagner
5,038,080 A    8/1991  Hirata
5,053,802 A    10/1991 Hirata
5,532,555 A    7/1996  Yamada
5,640,620 A    6/1997  Matsui
6,069,401 A    5/2000  Nakamura et al.
6,081,076 A    6/2000  Ogawa
6,448,645 B1   9/2002  Kimura et al.
6,975,023 B2 * 12/2005 Oliver et al. ............... 257/676
2003/0062608 A1 4/2003 Hamachi

FOREIGN PATENT DOCUMENTS

JP         8-162631        6/1996

* cited by examiner

*Primary Examiner*—Evan Pert
*Assistant Examiner*—Fazli Erdem
(74) *Attorney, Agent, or Firm*—Oblon, Spivak, McClelland, Maier & Neustadt, P.C.

(57) ABSTRACT

As external connection terminals for an emitter electrode (12) of an IGBT chip, a first emitter terminal (151) for electrically connecting a light emitter in a strobe light control circuit to the emitter electrode (12) and a second emitter terminal (152) for connecting a drive circuit for driving an IGBT device to the emitter electrode (12) are provided. The first emitter terminal (151) and the second emitter terminal (152) are individually connected to the emitter terminal (12) by wire bonding.

5 Claims, 3 Drawing Sheets

STROBE LIGHT CONTROL CIRCUIT AND IGBT DEVICE

CROSS-REFERENCE TO RELATED APPLICATIONS

The present application is a continuation of U.S. application Ser. No. 10/373,873, filed on Feb. 27, 2003 now U.S. Pat. No. 6,879,024, and in turn claims priority to JP 2002/266,666 filed on Sep. 12, 2002, the entire contents of each of which are hereby incorporated herein by reference.

BACKGROUND OF THE INVENTION

1. Field of the Invention

The present invention relates to a strobe light control circuit for a camera, and more particularly to an insulated gate bipolar transistor (IGBT) for a strobe light.

2. Description of the Background Art

Insulated gate bipolar transistors (hereinafter referred to as "IGBT") in 8-pin IC packages, for example, are widely employed as semiconductor elements for controlling strobe lights of cameras.

FIG. 4 is a top view showing the configuration of a conventional IGBT device for controlling a strobe light. A common IGBT device in TSSOP-8 package is illustrated here as an example. A semiconductor chip (IGBT chip) 10 has a gate electrode 11 and an emitter electrode 12 formed on its upper surface and a collector electrode (not shown) formed on its lower surface. The IGBT chip 10 is mounted on a lead frame 13 and bonded thereto by solder or the like such that the collector electrode formed on its lower surface is electrically connected to the lead frame 13. That is, the lead frame 13 functions as an external connection terminal (collector terminal) for the collector electrode of the IGBT chip 10.

A gate terminal 14 is an external connection terminal for the gate electrode 11 and is connected to the gate electrode 11 via a wire 14a made of metal. An emitter terminal 15 is an external connection terminal for the emitter electrode 12 and is connected to the emitter electrode 12 via wires 15a made of metal.

The above-described components are enclosed in a package 16 made of resin indicated by broken lines in FIG. 4 to constitute one IGBT device. In FIG. 4, the numbers 1 through 8 indicate the pin numbers of the IGBT device.

FIG. 5 is a circuit diagram showing an exemplary strobe light control circuit to which the conventional IGBT device shown in FIG. 4 is adopted. In the drawing, nodes that correspond to the components shown in FIG. 4 are designated by the same reference characters for ease of description. As shown in FIG. 5, a light emitter 20, an electrolytic capacitor 21, a switch 22 and a voltage source 23 are connected between the lead frame 13 as the collector terminal of the IGBT device and the emitter terminal 15. A drive circuit 24 for generating a voltage signal for driving the IGBT device is connected between the gate terminal 14 and emitter terminal 15. Resistances R14a and R15a are wiring resistances provided for the wires 14a and 15a, respectively.

Hereinafter, the operation of the conventional strobe light control circuit will be described. First, the switch 22 is turned on to cause the voltage source 23 to apply a predetermined value of voltage across the electrolytic capacitor 21. Therefore, a necessary amount of charges for the light emitter 20 to emit light is stored in the electrolytic capacitor 21. At this time, the IGBT chip 10 is in the OFF state.

Once a sufficient amount of charges is stored in the electrolytic capacitor 21, the drive circuit 24 applies a voltage pulse (voltage signal) having a predetermined amplitude on the basis of the voltage at the emitter terminal 152 to the gate terminal 14. This brings the IGBT chip 10 into the ON state. Then, the charges stored in the electrolytic capacitor 21 flow into the light emitter 20 (i.e., a large currently flows), allowing the light emitter 20 to emit light brightly for illuminating a subject.

As described, when the IGBT chip 10 is turned on and a large amount of charges, i.e., current flows into the IGBT chip 10, a large current also flows through the wires 15a as a matter of course. This causes a voltage drop at the wires 15a due to the wiring resistance R15a. Thus, during the voltage drop, the voltage inputted to the gate terminal 14 from the drive circuit 24 is reduced by this voltage drop.

Accordingly, although the drive circuit 24 applies a voltage signal having a sufficient amplitude for driving the IGBT chip 10 between the gate terminal 14 and emitter terminal 15, a phenomenon occurs that a voltage having an amplitude smaller than that of the above-described voltage applied between the gate terminal 14 and emitter terminal 15 is applied between the gate electrode 11 and emitter electrode 12. As a result, light emission failure of the strobe light and a malfunction due to noise easily occur.

As a resolution to such drawbacks, a method has conventionally been employed in which the amplitude of a voltage signal generated by the drive circuit 24 is increased in advance taking the voltage drop due to the resistance R15a into consideration, thereby providing a margin for a driving voltage (threshold voltage) for the IGBT chip 10.

The configuration of the above-described conventional IGBT device for controlling a strobe light is already in common use, and the above description is based on the inventor's knowledge. He has not found any published document that specifically discloses the configuration.

On the other hand, there is a technique to be used for an inverter circuit for preventing an adverse influence from being exerted upon an overcurrent protection circuit due to wiring inductance in an IGBT module including the overcurrent protection circuit (e.g., Japanese Patent Laid-Open No. 8-162631 (hereinafter referred to as document 1); pp. 2-3, FIGS. 1 and 2). The overcurrent protection circuit is connected to an emitter electrode inside the IGBT module. Potential variations at the emitter electrode due to load current variations (di/dt) in an inverter circuit and wiring inductance of the IGBT module cause the overcurrent protection circuit to malfunction. The document 1 describes providing the IGBT module with an auxiliary emitter terminal that connects the emitter electrode to a ground terminal of a gate drive circuit, thereby preventing a malfunction of the overcurrent protection circuit due to potential variations at the emitter electrode.

In digital camera equipment, for example, there is a trend toward lower supply voltage for internal circuits of such equipment with lower power consumption in recent years. For instance, a value of supply voltage for internal circuits in conventional digital cameras has mainly been 5.0V, which, however, is being changed to 3.3V recently. A decrease in supply voltage for a circuit naturally imposes a limit on increasing an output voltage from the drive circuit 24. It is thus becoming difficult to implement the method of increasing a margin for a voltage signal.

Therefore, a drive voltage for an IGBT chip for controlling a strobe light, which has mainly been 4.0V is required to be reduced to about 2.5V. This allows a large margin for a drive voltage for an IGBT chip even with a low supply voltage. However, merely decreasing a drive voltage for the IGBT chip disadvantageously degrades the IGBT chip itself in noise immunity.

SUMMARY OF THE INVENTION

An object of the present invention is to provide an IGBT device having high noise immunity, capable of preventing light emission failure and a malfunction in a strobe light control circuit even with a low supply voltage.

According to a first aspect of the present invention, the strobe light control circuit includes a light emitter, an insulated gate bipolar transistor (IGBT) device and a drive circuit. The IGBT device is configured to turn on/off a current flowing in the light emitter, with the light emitter connected between an emitter and a collector of the IGBT device. The drive circuit is configured to apply a voltage signal for driving the IGBT device between the emitter and a gate of the IGBT device. The IGBT device includes an IGBT chip, a first emitter terminal configured to electrically connect the light emitter to an emitter electrode of the IGBT chip and a second emitter terminal configured to connect the drive circuit to the emitter electrode of the IGBT chip. The first emitter terminal and the second emitter terminal are individually connected to the emitter electrode.

According to a second aspect of the present invention, an insulated gate bipolar transistor (IGBT) device for controlling a strobe light configured to turn on/off a current flowing in a light emitter includes an IGBT chip, a lead frame on which the IGBT chip is mounted, a gate terminal, a first emitter terminal and a second emitter terminal. The lead frame serves as an external connection terminal configured to electrically connect the light emitter to a collector electrode of the IGBT chip. The gate terminal serves as an external connection terminal configured to apply a voltage signal for driving the IGBT chip to a gate electrode of the IGBT chip. The first emitter terminal serves as an external connection terminal configured to electrically connect the light emitter to an emitter electrode of the IGBT chip. The second emitter terminal serves as an external connection terminal configured to apply a reference voltage for the voltage signal to the emitter electrode of the IGBT chip. The first emitter terminal and the second emitter terminal are individually connected to the emitter electrode by wire bonding.

A voltage signal applied by the drive circuit between the gate terminal and the second emitter terminal is applied between the gate electrode and emitter electrode with its amplitude unchanged. Therefore, it becomes unnecessary to provide a large margin for the amplitude of a voltage signal for driving the IGBT device, which allows the amplitude of the voltage signal generated by the drive circuit to be kept smaller than in a conventional strobe light control circuit. As a result, this contributes to reduced power requirements in, e.g., digital cameras in which strobe light control circuits are used. Further, the drive voltage for the IGBT chip can be set high to a certain degree even in the case where a supply voltage is low and the output voltage of the drive circuit is kept low, causing the output voltage of the drive circuit to be kept low. This makes it possible to suppress degradation of the IGBT chip in noise immunity.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
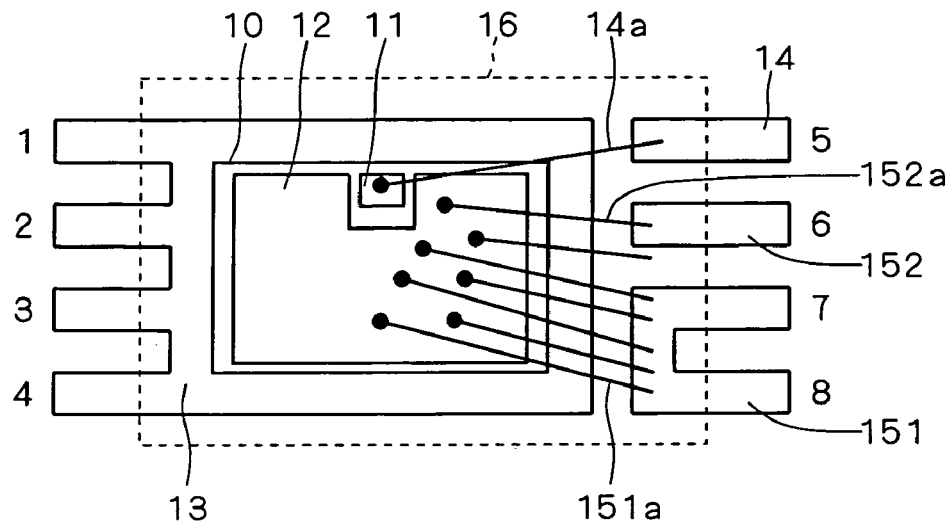
FIG. 1 is a top view showing the configuration of an IGBT device according to a first preferred embodiment of the present invention.
Figure 4:
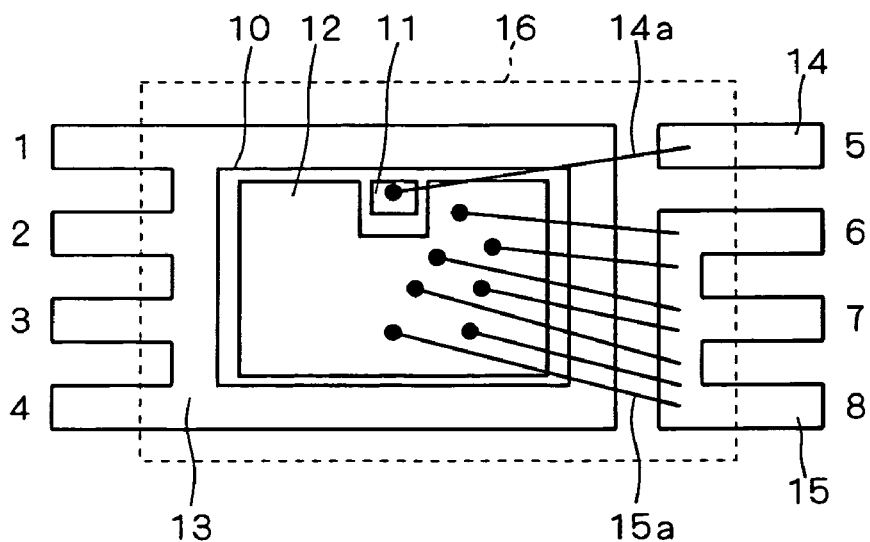
FIG. 4 is a view showing the configuration of a conventional IGBT device for controlling a strobe light.

FIG. 1 is a top view showing the configuration of an IGBT device according to a first preferred embodiment of the present invention. An IGBT device in TSSOP-8 package is also illustrated here. Components having the same functions as those shown in FIG. 4 are designated by the same reference characters, detailed explanation of which is thus omitted.

As shown in FIG. 1, the IGBT device has, as external connection terminals for the emitter electrode 12, a first emitter terminal 151 for connecting a light emitter in a strobe light control circuit to the emitter electrode 12 and a second emitter terminal 152 for connecting a drive circuit for driving the IGBT device to the emitter electrode 12.

The first emitter terminal 151 is connected to the emitter electrode 12 via wires 151a, while the second emitter terminal 152 is connected to the emitter electrode 12 via a wire 152a. That is, the first and second emitter terminals 151 and 152 are connected individually to the emitter electrode 12 by wire bonding.

In the present embodiment, layout is carried out such that the lead frame 13 as a collector terminal corresponds to pin Nos. 1 to 4, the gate terminal 14 corresponds to pin No. 5, the first emitter terminal 151 corresponds to pin Nos. 7 and 8, and the second emitter terminal 152 corresponds to pin No. 6 of the IGBT device. That is, as shown in FIG. 1, the lead frame 13 extends out from the package 16 in a first direction (i.e., to the left of the drawing), while the gate terminal 14, first emitter terminal 151 and second emitter terminal 152 extend out from the package 16 in a second direction opposite to the first direction (i.e., to the right of the drawing). The second emitter terminal 152 is provided adjacent to the gate terminal 14 so as to be the nearest terminal (pin) to the gate terminal 14.

Figure 2:
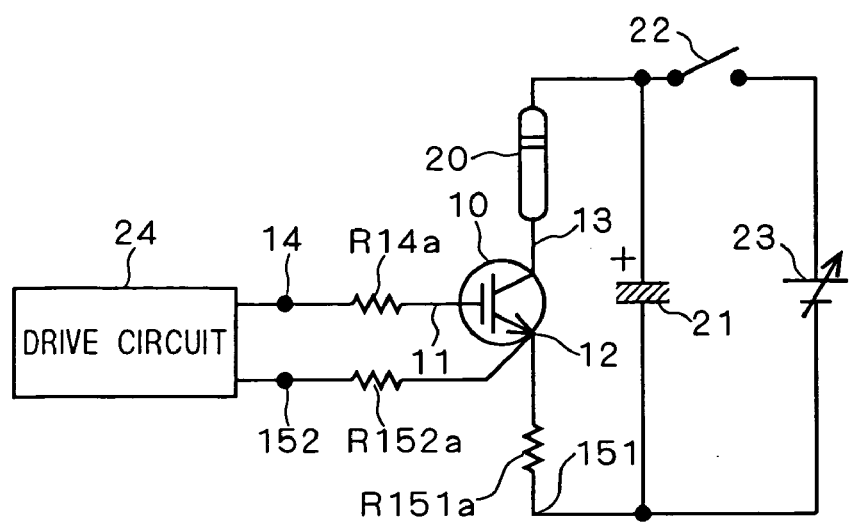
FIG. 2 is a circuit diagram showing an exemplary strobe light control circuit according to the first preferred embodiment.
Figure 5:
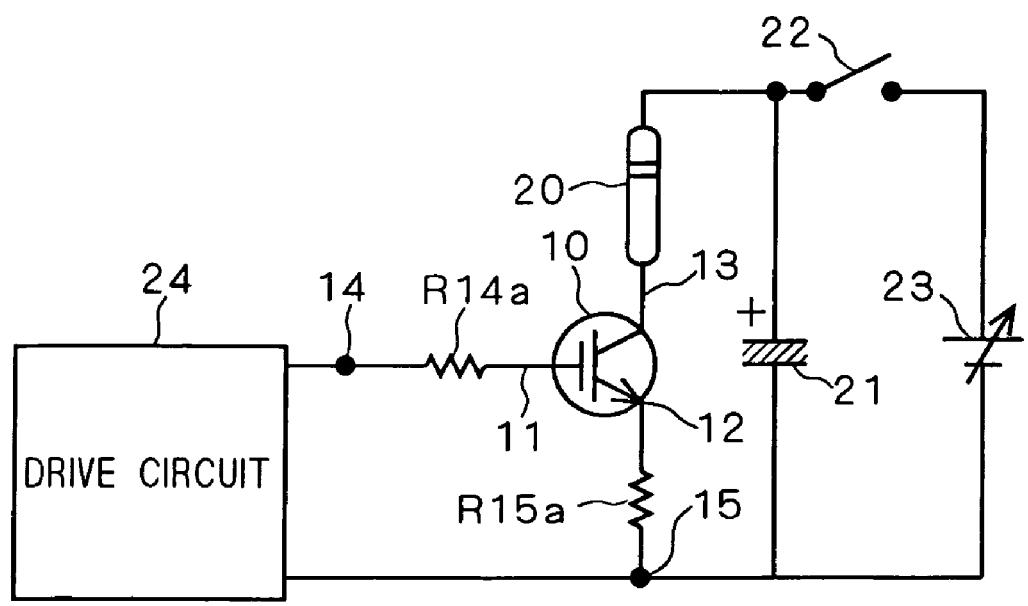
FIG. 5 is a circuit diagram showing an exemplary strobe light control circuit in which the conventional IGBT device is adopted.

FIG. 2 is a circuit diagram showing an exemplary strobe light control circuit according to the present embodiment to which the IGBT device shown in FIG. 1 is adopted. In the drawing, nodes that correspond to the components shown in FIG. 1 are designated by the same reference characters for ease of description. The same components as those shown in FIG. 5 are designated by the same reference characters. Resistances R151a and R152a are wiring resistances provided for the wires 151a and 152a, respectively.

As shown in FIG. 2, the light emitter 20, electrolytic capacitor 21, switch 22 and voltage source 23 are connected between the lead frame 13 as the collector terminal of the IGBT device and first emitter terminal 151, while the drive circuit 24 is connected between the gate terminal 14 and second emitter terminal 152.

Hereinafter, the operation of a strobe light control circuit according to the present embodiment will be described. First, the switch 22 is turned on, so that a necessary amount of charges for the light emitter 20 to emit light is stored in the electrolytic capacitor 21 by means of the voltage source 23. At this time, the IGBT chip 10 is in the OFF state.

Once a sufficient amount of charges is stored in the electrolytic capacitor 21, the drive circuit 24 applies a voltage pulse (voltage signal) having a predetermined amplitude on the basis of the voltage at the emitter terminal 15 to the gate terminal 14. This brings the IGBT chip 10 into the ON state. Then, the charges stored in the electrolytic capacitor 21 flow into the light emitter 20 (i.e., a large currently flows), allowing the light emitter 20 to emit light brightly for illuminating a subject.

As described, when the IGBT chip 10 is turned on and a large amount of charges, i.e., current flows into the IGBT chip 10, a large current also flows through the first emitter terminal 151 and wires 151a. This causes a voltage drop at the wires 151a due to the wiring resistance R151a.

On the other hand, the input impedance between the gate electrode 11 and emitter electrode 12 of the IGBT chip 10 is so large that current hardly flows through the second emitter terminal 152 and wire 152a. That is, a voltage signal applied between the gate terminal 14 and the second emitter terminal 152 by the drive circuit 24 is applied between the gate electrode 11 and emitter electrode 12 on the IGBT chip 10 with its amplitude unchanged. In short, the amplitude of the voltage signal applied between the gate electrode 11 and emitter electrode 12 is not affected by the voltage drop at the wires 151a.

Therefore, it becomes unnecessary to provide a margin for the amplitude of the voltage signal for driving the IGBT device taking the voltage drop due to the resistance R151a into consideration. This allows the amplitude of the voltage signal generated by the drive circuit 24 to be kept smaller than in the conventional strobe light control circuit. As a result, this contributes to reduced power requirements in digital cameras, for example, in which strobe light control circuits are used.

That a large margin is not required for the voltage signal for driving the IGBT device means that the drive voltage for the IGBT chip is not required to be reduced more than necessary with respect to the amplitude of the voltage signal. Thus, the drive voltage for the IGBT chip 10 can be set nearly as high as an output voltage of the drive circuit 24 even in the case where a supply voltage is reduced to achieve lower power consumption and the output voltage of the drive circuit 24 is kept low. This makes it possible to suppress degradation of the IGBT chip 10 in noise immunity.

Further, the lead frame 13 extends out from the package 16 in the first direction, and the gate terminal 14, first emitter terminal 151 and second emitter terminal 152 extend out from the package 16 in the second direction opposite to the first direction, as in the conventional IGBT device shown in FIG. 4. This means that the lead frame 13 according to the present embodiment may be similar to that adopted in the conventional IGBT device shown in FIG. 4. That is, a die bonding pad for mounting an IGBT chip on the lead frame 13 can be set as large as that in the conventional IGBT device. In other words, implementation of the present invention will not involve a reduction in upper size limit on a mountable chip. Moreover, layout changes from the conventional IGBT device are minimized.

Furthermore, the second emitter terminal 152 is provided adjacent to the gate terminal 14, so that a wire for connecting the drive circuit 24 to the IGBT device on a circuit board on which the IGBT device is to be mounted is easily laid out separately from other wires. This facilitates wiring pattern design of the strobe light control circuit.

Second Preferred Embodiment

As described, when the IGBT device according to the present invention is in the ON state, a large current flows through the wires 151a. As is apparent from FIG. 1, the first emitter terminal 151 in the first preferred embodiment is smaller than the conventional emitter terminal 15 shown in FIG. 4. Thus, the number of wires 151a that can be used for bonding is inevitably smaller than that of conventional wires 15a. As a result, this disadvantageously increases the on-state resistance (conduction resistance) of the IGBT device and decreases the current-carrying capacity, thus causing a reduction in reliability of the IGBT device. Accordingly, an IGBT device that can avoid such drawbacks will be proposed in the present embodiment.

Figure 3:
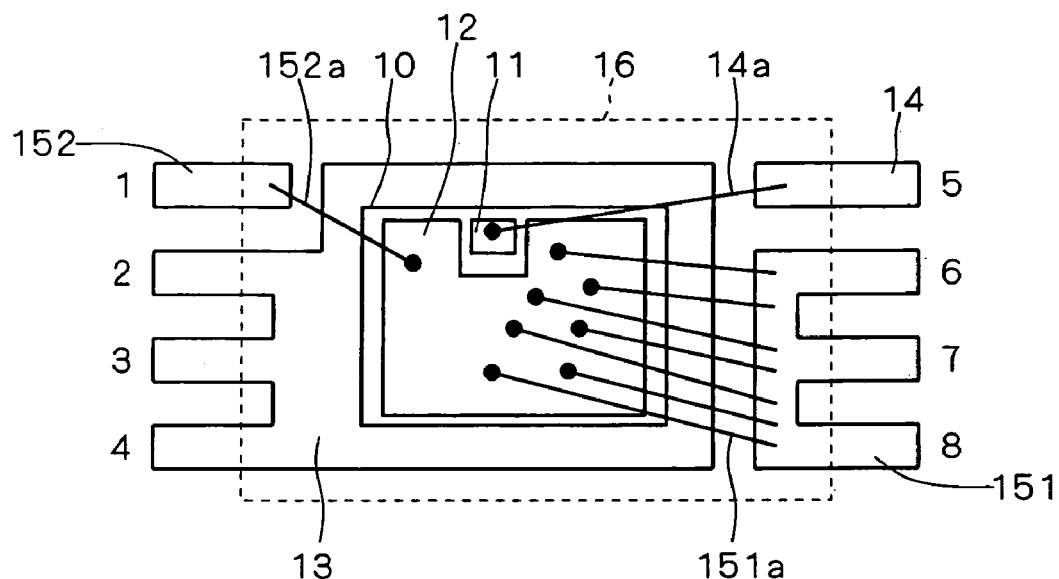
FIG. 3 is a top view showing the configuration of an IGBT device according to a second preferred embodiment of the present invention.

FIG. 3 is a top view showing the configuration of an IGBT device according to a second preferred embodiment of the present invention. An IGBT device in TSSOP-8 package is also illustrated here. Components having the same functions as those shown in FIGS. 1 and 4 are designated by the same reference characters, detailed explanation of which is thus omitted.

The IGBT device according to the present embodiment also has, as external connection terminals for the emitter electrode 12, the first emitter terminal 151 for electrically connecting a light emitter in a strobe light control circuit to the emitter electrode 12 and the second emitter terminal 152 for connecting a drive circuit for driving the IGBT device to the emitter electrode 12.

The first emitter terminal 151 is connected to the emitter electrode 12 via wires 151a, while the second emitter terminal 152 is connected to the emitter electrode 12 via a wire 152a. That is, the first and second emitter terminals 151 and 152 are connected individually to the emitter electrode 12 by wire bonding.

In the present embodiment, layout is carried out as shown in FIG. 3 such that the lead frame 13 as a collector terminal corresponds to pin Nos. 2 to 4, the gate terminal 14 corresponds to pin No. 5, the first emitter terminal 151 corresponds to pin Nos. 6 to 8, and the second emitter terminal 152 corresponds to pin No. 1 of the IGBT device. That is, the lead frame 13 and second emitter terminal 152 extend out from the package 16 in the first direction, while the gate terminal 14 and first emitter terminal 151 extend out from the package 16 in the second direction opposite to the first direction.

Such layout allows the first emitter terminal 151 to be made as large as the conventional emitter terminal 15 shown in FIG. 4. Thus, the number of wires 151a that can be used for bonding can be maintained at the same level as that of the conventional wires 15a. This makes it possible to suppress an increase in on-state resistance and a decrease in current-carrying capacity of the IGBT device by carrying out the present invention, suppressing a reduction in reliability of the IGBT device.

However, attention should be given to that a die bonding pad for mounting an IGBT chip on the lead frame 13 is reduced in size, thus reducing the upper size limit on a mountable chip.

The circuit configuration and operation of a strobe light control circuit to which the IGBT device according to the present embodiment is adopted are the same as described in the first preferred embodiment, repeated explanation of which is thus omitted. Further, similarly to the first preferred embodiment, it is clearly unnecessary to provide a margin for the amplitude of the voltage signal for driving the IGBT device taking the voltage drop due to the resistance R151*a* into consideration, thus allowing the amplitude of the voltage signal generated by the drive circuit 24 to be kept smaller than in the conventional strobe light control circuit.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device for controlling power supply to an electronic device, comprising:
   a semiconductor chip including an upper surface, a lower surface, a semiconductor element configured to control the power supply to the electronic device, an upper electrode formed on the upper surface, a gate electrode formed on the upper surface, and a lower electrode formed on the lower surface; and
   a lead frame including a first pin and a second pin each electrically connected to the upper electrode, a third pin electrically connected to the gate electrode, and a fourth pin electrically connected to the lower electrode;
   wherein the third pin is configured to receive a voltage signal for driving the semiconductor element,
   wherein the second pin is configured to connect a drive circuit for generating the voltage signal for driving the semiconductor element,
   wherein the first pin and the fourth pin are configured to electrically connect between a power source and the electronic device in series,
   wherein the first pin is electrically connected to the upper electrode via a plurality of bonding wire connections, and
   wherein the second pin is individually and electrically-independently connected to the upper electrode by a bonding wire connection.

2. The semiconductor device according to claim 1, wherein the electronic device is a light emitter.

3. The semiconductor device according to claim 1, wherein the electronic device is a light emitter for a strobe light.

4. The semiconductor device according to claim 1, wherein the semiconductor element is an insulated gate bipolar transistor.

5. The semiconductor device according to claim 1, wherein the power source comprises an electrolytic capacitor.

* * * * *